(12) United States Patent
Gray et al.

(10) Patent No.: US 8,316,192 B2
(45) Date of Patent: Nov. 20, 2012

(54) MULTIPLE-PORT MEMORY SYSTEMS AND METHODS

(75) Inventors: Scott Gray, Peoria, AZ (US); Nicholas Wilt, Glendale, AZ (US)

(73) Assignee: Honeywell International Inc., Morristown, NJ (US)

( * ) Notice: Subject to any disclaimer, the term of this patent is extended or adjusted under 35 U.S.C. 154(b) by 713 days.

(21) Appl. No.: 12/575,709

(22) Filed: Oct. 8, 2009

(65) Prior Publication Data

US 2011/0087847 A1 Apr. 14, 2011

(51) Int. Cl.
*G06F 12/00* (2006.01)
(52) U.S. Cl. .......................... 711/154; 711/170; 710/305
(58) Field of Classification Search .................. 711/154, 711/170; 710/305
See application file for complete search history.

(56) References Cited

U.S. PATENT DOCUMENTS

| | | | |
|---|---|---|---|
| 5,418,976 | A | 5/1995 | Iida |
| 6,067,595 | A | 5/2000 | Lindenstruth |
| 6,141,765 | A | 10/2000 | Sherman |
| 6,434,674 | B1 | 8/2002 | DeWilde et al. |
| 6,920,535 | B1 | 7/2005 | Poisner |
| 7,373,447 | B2 | 5/2008 | Filor |
| 7,443,760 | B2 | 10/2008 | Do |

*Primary Examiner* — Matthew Bradley
(74) *Attorney, Agent, or Firm* — Fogg & Powers LLC

(57) ABSTRACT

Systems and methods for improved multiple-port memory are provided. In one embodiment, a processing system comprises: at least one processing core; a peripheral bus; and a memory for storing digital data, the memory divided into a first and a second partition of memory segments. The memory includes a first port coupled to the peripheral bus providing read access and write access only to the first partition, wherein the first partition stores peripheral data associated with one or more peripheral components coupled to the peripheral bus; a second port coupled to the at least one processor providing read-only access to only the second partition, wherein the second partition stores executable code for the at least one processing core; and a third port coupled to the at least one processor providing read access and write access to the entire first partition and the second partition.

20 Claims, 4 Drawing Sheets

MULTIPLE-PORT MEMORY SYSTEMS AND METHODS

BACKGROUND

In performing their various functions, processors have the need to provide and retrieve information to and from a system memory. Such information may include, for example, a program variable, instruction code, or peripheral data stored in the system's main memory. The processor reads the information from the system memory, executes one or more processes, and provides an appropriate output. In processing systems today, getting data in and out of system memory is time intensive. Furthermore, when a processor is waiting for data to be brought in, it is effectively stalled. One means known today for addressing this problem is the direct memory access (DMA) engine. The DMA engine is a hardware component that will obtain data from peripheral devices (known as peripheral data, or simply I/O data) and put that data into the main memory so that the processor itself does not need to execute a software subroutine to perform that task itself. However, when the DMA engine accesses the main memory, the processor must wait for the DMA engine to complete it's access before it can proceed with accessing the memory. If the processor needs program data or instruction code from the main memory to continue its processing at the same time the DMA is using the system memory, the processor must wait. This delay is commonly referred to in the art at "cycle stealing" because the DMA engine "steals" access to the memory from the processor for several cycles while the processor sits idle. Another means known today for improving processor throughput is commonly referred to as the "Harvard Architecture" that allows the processor to access memory via separate data and instruction ports. While this allows the processor to read instructions and access program variables concurrently from the memory, it does not solve the problem of the processor having to wait to access I/O data from peripheral devices.

For the reasons stated above and for other reasons stated below which will become apparent to those skilled in the art upon reading and understanding the specification, there is a need in the art for improved systems and methods for processor memory access.

SUMMARY

The Embodiments of the present invention provide methods and systems for improved multiple-port memory and will be understood by reading and studying the following specification.

Systems and methods for improved multiple-port memory are provided. In one embodiment, a processing system comprises: at least one processing core; a peripheral bus; and a memory for storing digital data, the memory divided into a first and a second partition of memory segments. The memory includes a first port coupled to the peripheral bus providing read access and write access only to the first partition, wherein the first partition stores peripheral data associated with one or more peripheral components coupled to the peripheral bus; a second port coupled to the at least one processor providing read-only access to only the second partition, wherein the second partition stores executable code for the at least one processing core; and a third port coupled to the at least one processor providing read access and write access to the entire first partition and the second partition.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention include embodiments drawn to processing devices known as a "system on a chip" in which at least one processor core, system memory, peripheral I/O busses and supporting functions are all resident on a single chip. The system memory is the main memory for the processor. Contents of the main memory will include 1) instruction code (also referred to herein as "instructions" or "executable code") to be executed by the processor core, 2) program variables created and used by the processor while executing the instruction code, and 3) peripheral data, which is either "input" data retrieved from peripheral devices for use by the processor core, or "output" data calculated by the processor core for use by the peripheral devices. Embodiments of the present invention provide a high speed access tri-port memory to provide the processor with unfettered access to the instruction code, the program variables, and the peripheral data.

Although the high speed access tri-port memory is referred to herein as a "memory" device, it may be implemented via a controller, microprocessor or state-machine that is co-resident on a chip with the processor core. As its name suggest, the high speed access tri-port memory provided by embodiments of the present invention provides a three port memory device having a first port allowing the processor core to retrieve instruction code from the memory device, a second port allowing the processor core to store program variable within the memory device and retrieve program variable from the memory device, and a third port allowing I/O data from peripheral devices to be stored and retrieved from the memory device.

Figure 1:
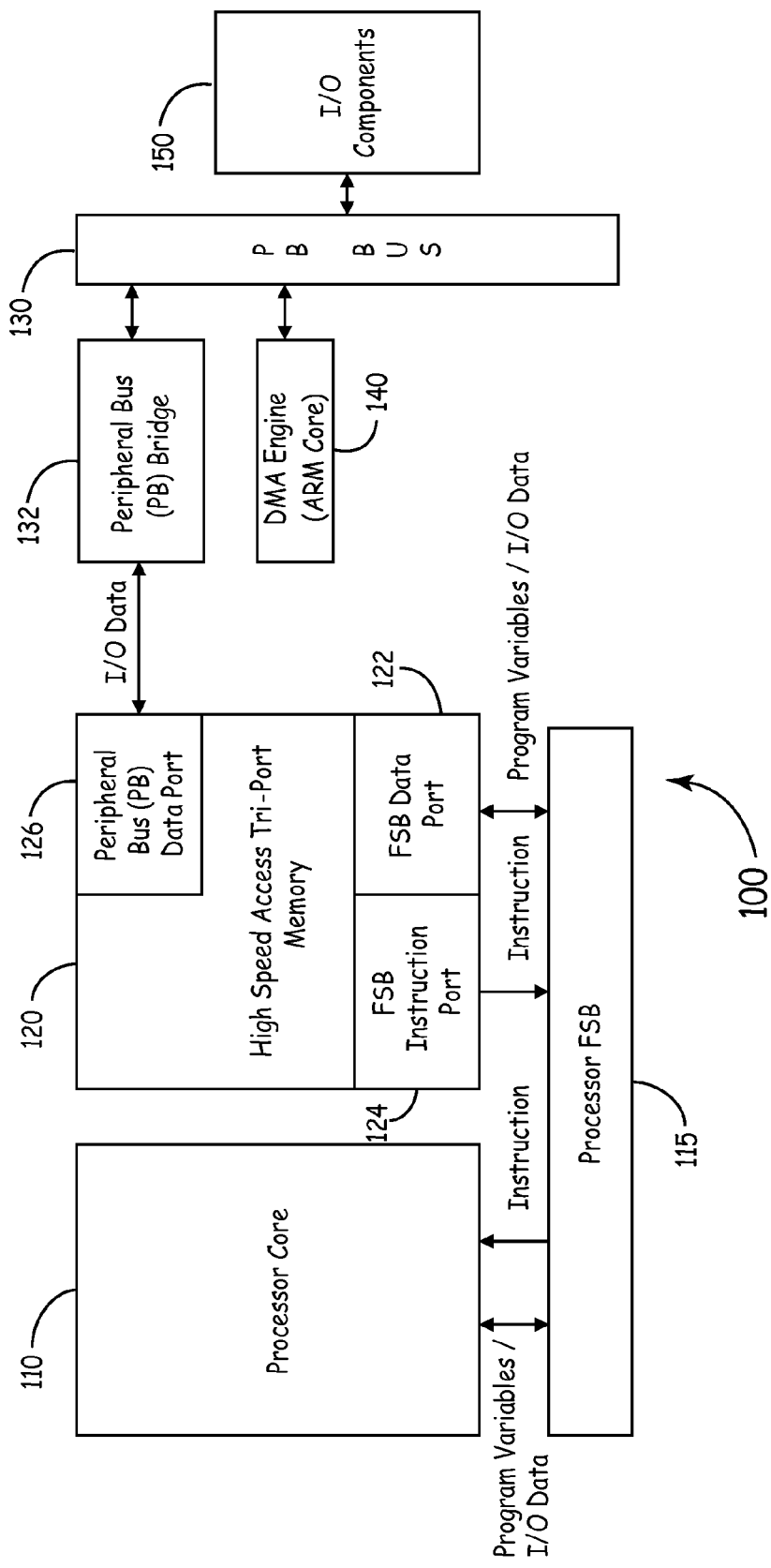
FIG. 1 is a diagram of a processing system of one embodiment of the present invention.

FIG. 1 is illustrates a processing system 100 of one embodiment of the present invention. Processing system 100 comprises a processing core 110, and a high speed access tri-port memory 120 coupled together via a front side bus (FSB) 115. The high speed access tri-port memory 120 (hereinafter, memory 120) comprises a read/write access FSB Data port 122 and a read-only access FSB instruction port 124, both of which are coupled to FSB 115. Memory 120 further includes a Peripheral Bus (PB) port 126 coupled to a Peripheral Bus (130) via a Peripheral Bus (PB) Bridge 132. PB port 126 provides read/write access to memory 120 for one or more peripheral (I/O) components 150 coupled to PB Bus 130. I/O Components include devices such as, but not limited to sensors, displays, user interfaces, actuators, etc., which are either suppliers of data for use by processing core 110 or are consumers of the output produced by processing core 110. In one embodiment, processing system 100 further includes a direct memory access (DMA) engine 140 which functions to retrieve I/O data from I/O components 150 and store data appropriately into memory 120 via PB port 126. Similarly, DMA engine 140 will fetch via PB port 126 I/O data requested by I/O components. In one embodiment, DMA engine 140 is implemented within system 100 using an ARM processing core. In an alternate embodiment, DMA engine 140 is a separate component coupled to PB 130. Also in alternate embodiment, processor core 110 includes at least one processor core.

In operation, when processing core 110 requires instruction code from memory 120, it fetches the instruction via FSB instruction port 124. When processing core 110 needs access to either I/O data or a program variable, it accesses that data via FSB data port 122. Because instruction and data is accessible by processor core 110 via separate ports, (and for reasons that will be described in greater detail below) processor core 110 can access data via both FSB instruction port 124 and FSB data port 122 concurrently. Similarly, I/O components 150 are able to read and write I/O data to memory 120 via PB port 126, without inhibiting processor core 110's ability to access memory 120 via either FSB instruction port 124 or FSB data port 122. That is, I/O data may be pushed or retrieved from memory 120 via the PB data port 126 concurrently with the processor core retrieving instruction code from the FSB instruction port 124 and/or the processor core retrieving Program Variable and/or I/O data from the FSB data port 122.

Figure 2:
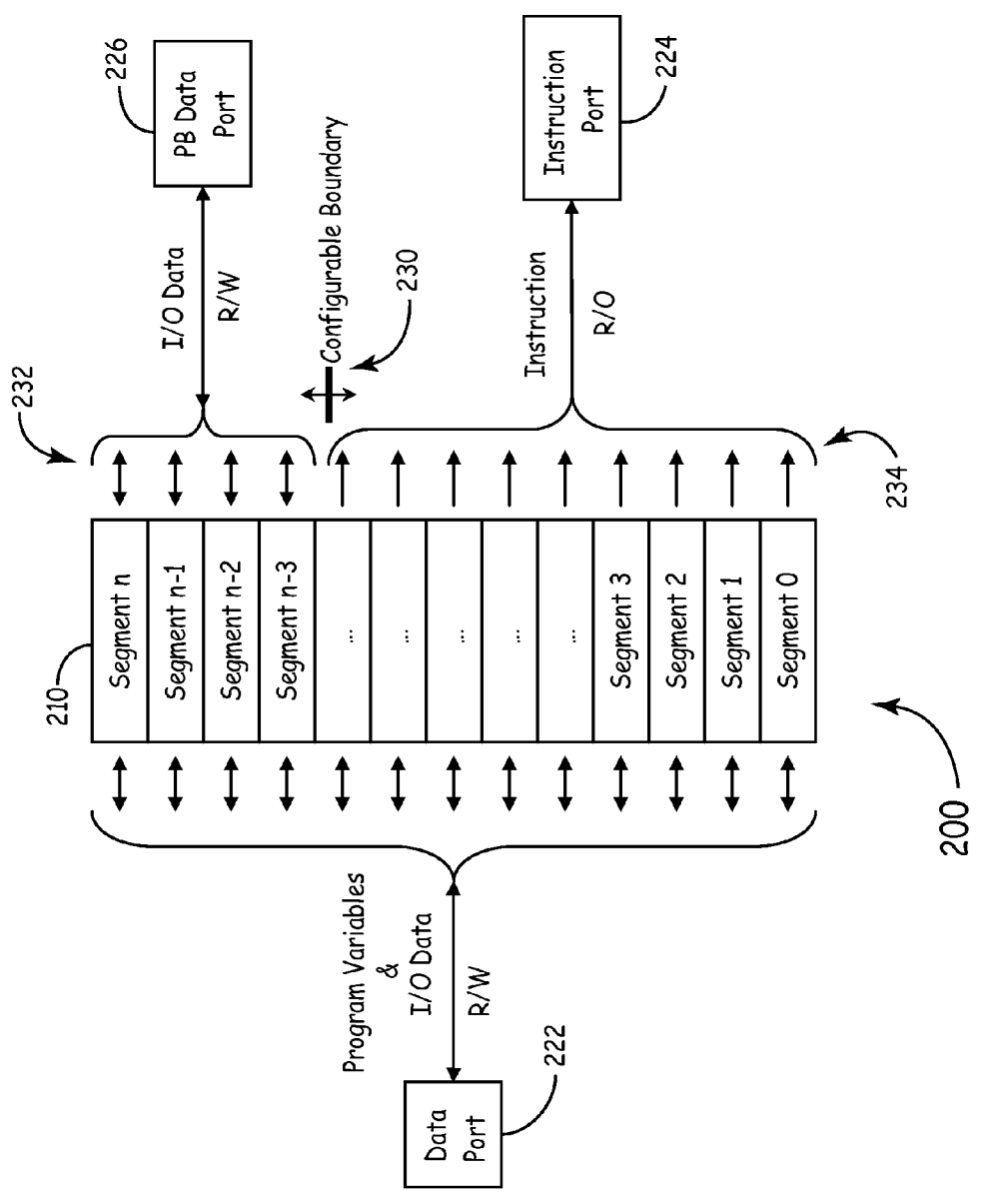
FIG. 2 is a diagram of a multiple port memory device of one embodiment of the present invention.

High speed access tri-port memory 120 is now explained in greater detail by referring to FIG. 2. FIG. 2 is a diagram illustrating a high speed access tri-port memory 200 (hereinafter, memory 200) of one embodiment of the present invention, such as the high speed access tri-port memory 120 of FIG. 1. In such case, instruction port 224 correlates with FSB instruction port 124, Data port 222 correlates with FSB data port 122 and PB data port 226 correlates with PB data port 124. Memory 200 comprises a peripheral bus (PB) port 226 providing read and write access to a first partition of memory segments 210 (shown generally at 232) in which peripheral (I/O) data is stored. Memory 200 further comprises an instruction port 224 providing read only access to a second partition of memory segments 220 (shown generally at 234) in which instruction code for execution (by processor core 110, for example) is stored. Memory 200 further comprises a data port 222 providing read and write access to the entire range of memory segments 210.

Each of the segments 210 represent a range of memory addresses in memory device 200. For example, in one embodiment, when memory device 200 is a 128 MB device and there are 32 segments 210, then each segment 210 represents a 4 MB range of memory addresses. In one embodiment, the address for a particular item would be the same regardless of which port is used to access the data. In other words, address 00 of segment 0 contains the first word of segment zero as viewed from either data port 222 or instruction port 224. Similarly, the first address of segment n−3 contains the first word of that segment as viewed from either data port 222 or PB port 226. From the processor core's perspective, if data is fetched as an instruction, it will be delivered out the instruction bus, regardless of its address within memory 200. Similarly, if a program variable or I/O data is fetched, it will be delivered out the data port regardless of its address within memory 200. The processor core and software linkages handle the housekeeping functions for keeping track of which data is stored at what address. Further, in one embodiment, the first and second partitions are defined logically. That is, the partitions represent a logical division of memory segments within memory device 200 rather than a division having any physical connotations.

In one embodiment, in operation, when system 100 is initialized, memory 120 is empty and does not hold any instruction code. Instead of turning to memory 120 for instruction, processor core 110 refers to a non-volatile memory (NVM) such as, but not limited to, a programmable read only memory (PROM). Processor core 110 will download and execute code from the NVM and push instruction code from the NVM into the instruction designated partition 234 via the FSB data port 122. From that point, the processor core 110 will jump over to memory 120 and begin executing instruction code retrieved via the FSB instruction port 122. Having been initialized, processor code 110 can now fetch and execute instruction code from memory 120 concurrently with fetching data from memory 120.

While the actual instruction code within the segments 210 of partition 234 are static (that is, the program executed by the processor is not self-modifying) the program variables stored in partition 234 are not static. However, because addresses holding instruction are written to only once (at initialization), there is no concern that processor core 110 will attempt to read an instruction via the FSB instruction port 124 while at the same time that instruction is being modified via the FSB data port 122. Likewise, the processor core 110 can freely read and write program variables into those same segments, because the addresses used to hold the program variables are not the same as those used to hold instruction code.

With respect to segments 210 within partition 232, the situation is somewhat different because both processing core 110 and devices connected to PB Bus 130 may be attempting to access the same I/O data item at the same time. Concurrent read requests to an I/O data item does not pose a problem and may be performed concurrently via FSB 122 and PB data port 126. An issue occurs when either concurrent write access requests for the same I/O data item are received, or when read access is requested on one port while that data is being modified via the other port. To address this issue, in one embodiment, arbitration is utilized within partition 232. For example, in one embodiment, write access via FSB data port 122 is authorized to write to a first group of addresses within partition 232 for a first period of time and is authorized for a second group of addresses within partition 232 for a second period of time. Meanwhile, write access via PB data port 126 is authorized to write to the second group of addresses within partition 232 for the first period of time and the first group of addresses within partition 232 for the second period of time. In other embodiments, other arbitration schemes, such a using semaphores to indicate when an I/O data item is currently being modified are used. As would be appreciated from the discussion above, access to Program Variables stored in partition 232 need not be arbitrated because only the processor core 110 would be authorized to access those items.

The segmentation of the High speed access tri-port memory provides configurability as to how much of the memory is available for storing to I/O data and how much is available for storing instruction. Referring again to FIG. 2, the location of the configurable boundary 230 between the I/O data partition 232 and the instruction partition 234 is determined based on system design needs. The ratio between the two partitions is based on the I/O requirements for the system (i.e., the size and quantity of I/O data items that need to be accessed by the processor core), and the amount of instruction code necessary for the processor core to perform its task. The segmentation boundary 230 may be static (for example, hardwired or determined and established at device initialization) or dynamically configurable. In one embodiment where the segmentation boundary is either established at initialization or dynamically altered, the FSB and PB will both also be configured accordingly to access memory segments via the ports as described above.

Figure 3:
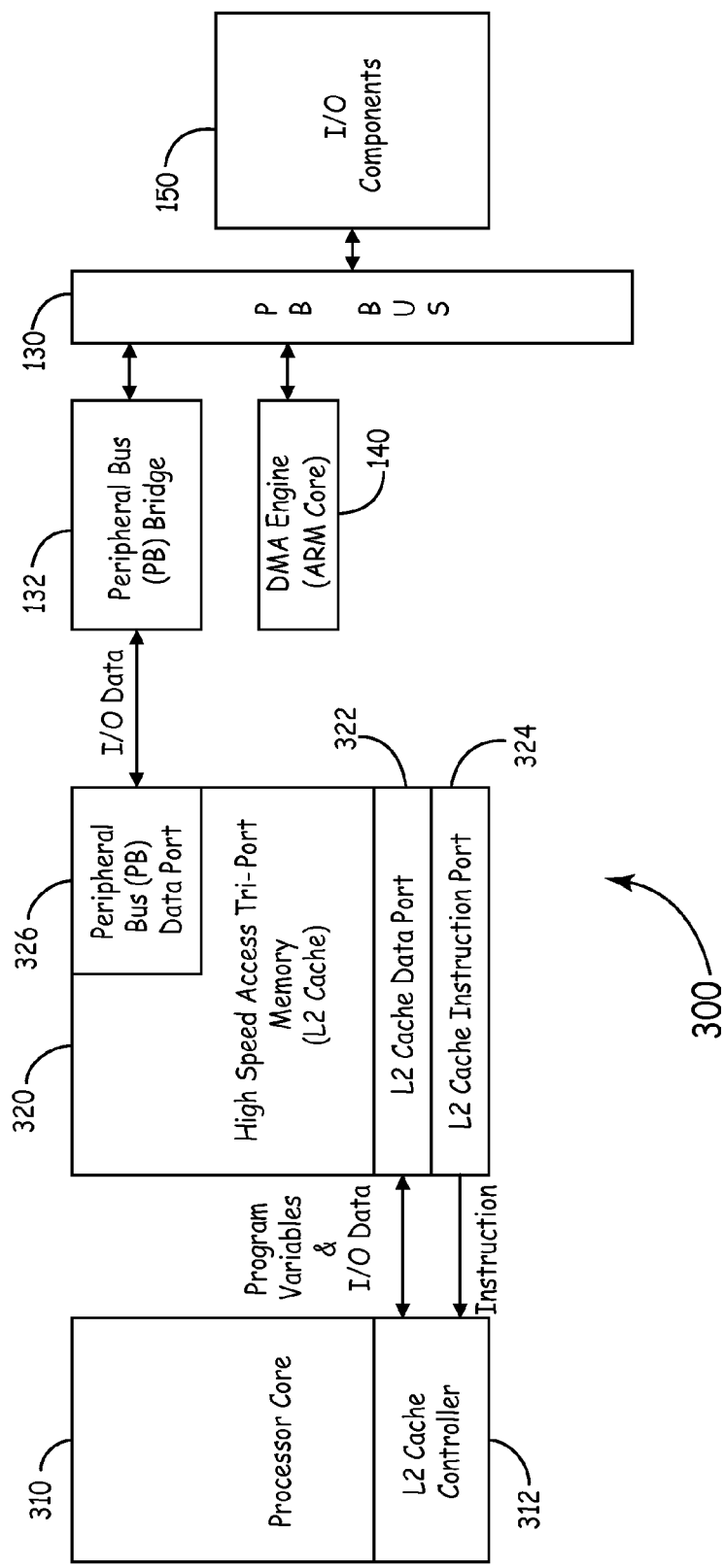
FIG. 3 is a diagram of an alternate processing system of one embodiment of the present invention.

FIG. 3 is an illustration of an alternate processing system 300 of one embodiment of the present invention. Processing system 300 operates under the same principals as processing system 100 except that the high speed access tri-port memory 320 in system 300 is implemented as an L2 Cache coupled directly to processor core 310 (via an L2 Cache Controller 312) rather than through a front side bus.

The high speed access tri-port memory 320 (hereinafter, memory 320) comprises a read/write access L2 Cache Data port 322 and a read-only access L2 Cache Instruction port 324, both of which are coupled to the L2 Cache Controller 312. Memory 320 further includes a Peripheral Bus (PB) port 326 coupled to a Peripheral Bus (330) via a Peripheral Bus (PB) Bridge 332. PB port 326 provides read/write access to memory 320 for one or more I/O components 350 coupled to PB Bus 330. In one embodiment, processing system 300 further includes a direct memory access (DMA) engine 340 which functions to retrieve I/O data from I/O components 350 and store them appropriately into memory 320 via PB port 326 as described above in FIG. 1 with respect to DMA engine 140.

Figure 4:
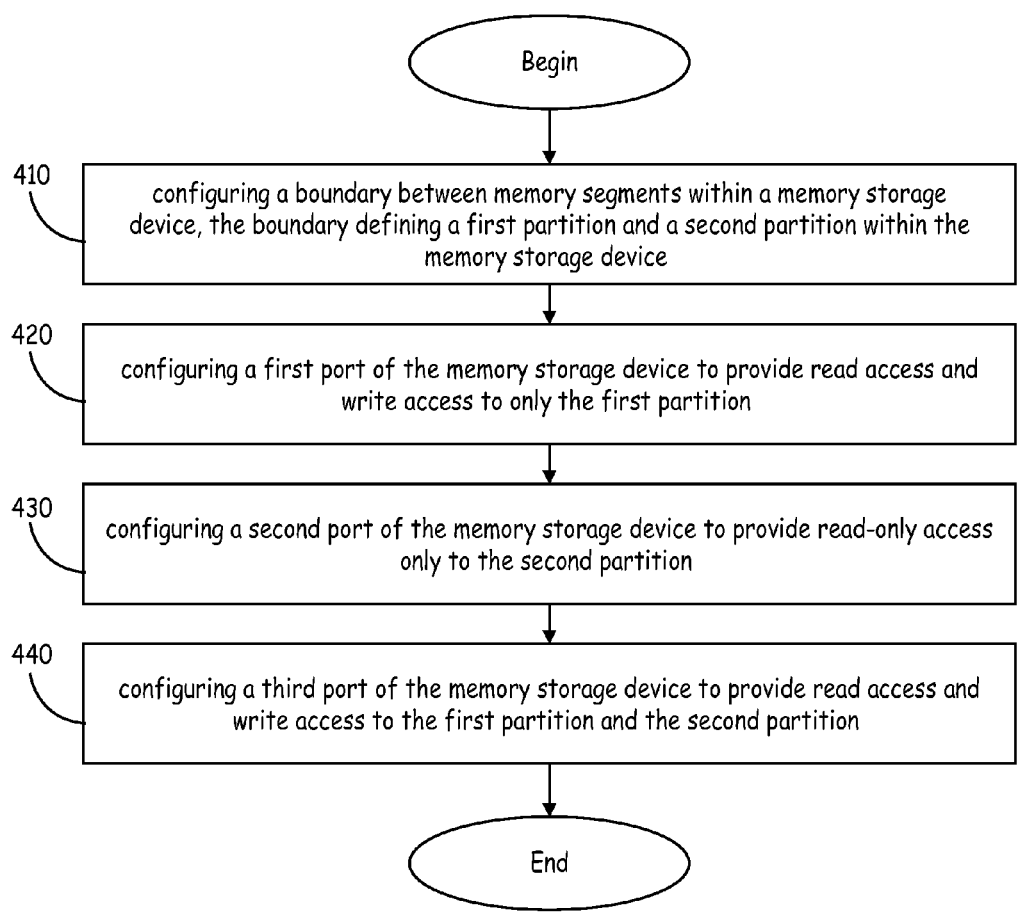
FIG. 4 is a flow chart illustrating a method of one embodiment of the present invention.

FIG. 4 is a flow chart illustrating a method of one embodiment of the present invention. The method begins at 410 with configuring a boundary between memory segments within a memory storage device, the boundary defining a first partition and a second partition within the memory storage device. As discussed above, the memory storage device may be implemented using a controller, microprocessor or state-machine that is co-resident on a chip with a processing core. The location of the configurable boundary between the first and the second partition may be determined by one of ordinary skill in the art upon reading this specification based on system design needs. The ratio between the two partitions is based on the size and quantity of peripheral data items that need to be accessed by the processor core, and the amount of instruction code necessary for the processor core to perform its tasks. The segmentation boundary may be static, dynamically configurable, or configured once during a system initialization.

The method proceeds to 420 with configuring a first port of the memory storage device to provide read access and write access to only the first partition. In one embodiment, a peripheral bus is coupled to the first port of the memory storage device which allows the peripheral bus to store and retrieve peripheral data via the first port. In one embodiment, a direct memory access (DMA) engine is coupled to the peripheral bus to load and retrieve data from the memory storage device for one or more peripheral components coupled to the peripheral bus.

The method proceeds to 430 with configuring a second port of the memory storage device to provide read-only access only to the second partition and to 440 with configuring a third port of the memory storage device to provide read access and write access to the first partition and the second partition. At least one processing core is coupled to the memory storage device and accesses the memory storage device through the second and third ports. When the processing core needs to retrieve additional instructions for executing a task, it fetches executable code from within the second segment via the second port. Although the processing core also has access to the memory device through the third port, it will only retrieve instruction code through the read-only second port. The third port is utilized by the processing core to access program variables and peripheral data.

While instruction code stored in the second partition is static, the program variables stored in the partition are not. Because the processor core transfers instructions into the memory device only at initialization, there is no concern that the processor core will attempt to read an instruction at the same time that instruction is being modified. Likewise, the processor core can read and write program variables into those same segments of the second partition, because the addresses within the second segment used to hold the program variables are not the same as those used to hold instruction code.

With embodiments of the present invention, the peripheral bus and the processor core also access the first memory segment from separate ports. The processor core may thus readily retrieve peripheral data and program variables from the memory device without having to wait for the peripheral bus to finish accessing the memory device.

Several means are available to implement the systems and methods of the current invention as discussed in this specification. These means include digital computer systems, microprocessors, general purpose computers, state machines, programmable controllers and field programmable gate arrays. Therefore other embodiments of the present invention are program instructions resident on computer readable media which when implemented by such devices, enable the controllers to implement embodiments of the present invention. Computer readable media includes any form of a physical computer data storage device, including but not limited to punch cards, magnetic disk or tape, any optical data storage system, flash read only memory (ROM), non-volatile ROM, programmable ROM (PROM), erasable-programmable ROM (E-PROM), random access memory (RAM), or any other form of permanent, semi-permanent, or temporary memory storage system or device. Program instructions include, but are not limited to computer-executable instructions executed by computer system processors and hardware description languages such as Very High Speed Integrated Circuit (VHSIC) Hardware Description Language (VHDL).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

We claim:

1. A multiple-port memory device, the device comprising:
   a memory for storing digital data, the memory divided into
      a first partition of memory segments and a second partition of memory segments;
   a first port coupled to the memory for providing a peripheral bus with read access and write access only to the first partition;
   a second port coupled to the memory for providing a processor with read-only access only to the second partition; and a third port coupled to the memory for providing a processor with read access and write access to the first partition and the second partition.

2. The device of claim 1, wherein the memory is logically divided into the first partition and the second partition.

3. The device of claim 1, wherein the first partition stores data associated with one or more peripherals coupled to the peripheral bus that communicate with the memory via first port; and
wherein the first partition further stores program variables accessed by the processor via the third port.

4. The device of claim 1, wherein the second partition stores executable computer code accessed by the processor via the second port; and
wherein the second partition further stores program variables accessed by the processor via the third port.

5. The device of claim 1, wherein each memory segment of the first partition and each memory segment of the second partition include a range of memory addresses within the memory.

6. A processing system, the processing system comprising:
at least one processing core;
a peripheral bus; and
a memory for storing digital data, the memory divided into a first partition of memory segments and a second partition of memory segments, the memory further including
a first port coupled to the peripheral bus, the first port providing read access and write access only to the first partition, wherein the first partition stores peripheral data associated with one or more peripheral components coupled to the peripheral bus;
a second port coupled to the at least one processor, the second port providing read-only access to only the second partition, wherein the second partition stores executable code for the at least one processing core; and
a third port coupled to the at least one processor, the third port providing read access and write access to the entire first partition and the second partition.

7. The processing system of claim 6, further comprising a configurable boundary that defines a first group of memory segments which comprise the first partition of the memory and a second group of memory segments which comprise the second partition of the memory.

8. The processing system of claim 7, wherein the at least one processing core determines the configurable boundary for separating the first partition from the second partition during system initialization.

9. The processing system of claim 6, further comprising a front side bus, wherein the memory is coupled to the at least one processing core via the front side bus.

10. The processing system of claim 6, further comprising a direct memory access (DMA) engine couple to the peripheral bus, wherein the DMA engine accesses data associated with one or more components coupled to the peripheral bus via the first port.

11. The processing system of claim 10, wherein the DMA engine receives data from the one or more components and stores said data in the first partition of the memory; and
wherein the DMA engine retrieves data requested by the one or more components from the first partition of the memory.

12. The processing system of claim 6, wherein the at least one processing core access the memory via the second port and the third port concurrently.

13. The processing system of claim 6, wherein the at least one processing core and the peripheral bus arbitrate write access to peripheral data stored in the first partition of the memory.

14. The processing system of claim 6, wherein the at least one processing core loads the executable code into the second partition of the memory by writing the executable code to the memory through the third port.

15. The processing system of claim 6, wherein the at least one processing core accesses program variables stored in either the first partition or the second partition through the third port; and wherein the processor accesses peripheral data stored in the first partition through the third port.

16. A method for accessing a multiple port memory device, the method comprising:
configuring a boundary between memory segments within a memory storage device, the boundary defining a first partition and a second partition within the memory storage device;
configuring a first port of the memory storage device to provide read access and write access to only the first partition;
configuring a second port of the memory storage device to provide read-only access only to the second partition; and
configuring a third port of the memory storage device to provide read access and write access to the first partition and the second partition.

17. The method of claim 16, further comprising:
coupling at least one processing core to the second port and the third port of the memory storage device;
wherein the at least one processing core fetches executable code from the second segment only through the second port; and
wherein the at least one processing core accesses program variables and peripheral data only through the third port.

18. The method of claim 17, further comprising:
storing the executable code into the second partition by writing the executable code to the third port.

19. The method of claim 16, further comprising:
coupling a peripheral bus to the first port of the memory storage device; and
wherein the peripheral bus stores and retrieves peripheral data via the first port 20. The method of claim 16, further comprising:
retrieving peripheral data from a peripheral component and storing the peripheral data into the first port using a direct memory access (DMA) engine coupled to the peripheral bus.

* * * * *